(12) United States Patent
Buhl et al.

(10) Patent No.: US 10,739,685 B2
(45) Date of Patent: Aug. 11, 2020

(54) PROCESS CONTROL METHOD FOR LITHOGRAPHICALLY PROCESSED SEMICONDUCTOR DEVICES

(71) Applicant: Qoniac GmbH, Dresden (DE)

(72) Inventors: Stefan Buhl, Dresden (DE); Boris Habets, Dresden (DE); Wan-Soo Kim, Dresden (DE)

(73) Assignee: Qoniac GmbH, Dresden (DE)

( * ) Notice: Subject to any disclaimer, the term of this patent is extended or adjusted under 35 U.S.C. 154(b) by 256 days.

(21) Appl. No.: 15/896,583

(22) Filed: Feb. 14, 2018

(65) Prior Publication Data

US 2019/0250516 A1   Aug. 15, 2019

(51) Int. Cl.
  *G03F 7/20* (2006.01)
  *H01L 21/027* (2006.01)

(52) U.S. Cl.
  CPC ............ *G03F 7/705* (2013.01); *G03F 7/7055* (2013.01); *G03F 7/70525* (2013.01); *G03F 7/70558* (2013.01); *G03F 7/70625* (2013.01); *G03F 7/70641* (2013.01); *H01L 21/0274* (2013.01)

(58) Field of Classification Search
  CPC .... G03F 7/705; G03F 7/70525; G03F 7/7055; G03F 7/70625; G03F 7/70558; G03F 7/70641

USPC .......................................................... 430/30
  See application file for complete search history.

(56) References Cited

U.S. PATENT DOCUMENTS

| 6,777,147 B1 * | 8/2004 | Fonseca | G03F 7/70466 430/30 |
| 7,108,945 B2 * | 9/2006 | Sutani | G03F 7/70641 430/30 |
| 9,964,853 B2 * | 5/2018 | Vanoppen | G03F 7/70558 |

* cited by examiner

*Primary Examiner* — Christopher G Young
(74) *Attorney, Agent, or Firm* — Hodgson Russ LLP

(57) ABSTRACT

Photoresist layers are exposed to an exposure beam by using an exposure tool assembly, wherein the photoresist layers coat semiconductor substrates and wherein for each exposure a current exposure parameter set is used that includes at least a defocus value and an exposure dose. The exposed photoresist layers are developed, wherein resist patterns are formed from the photoresist layers. Feature characteristics in the resist patterns and/or in substrate patterns derived from the resist patterns are measured. The current exposure parameter set is updated in response to deviations of the measured feature characteristics from target feature characteristics. De-corrected feature characteristics of hypothetical resist patterns are estimated, which would be formed without updating the exposure parameter set. In response to information obtained from the de-corrected feature characteristics the measurement strategy for the feature characteristics may be changed or the current exposure parameter set may be updated.

15 Claims, 8 Drawing Sheets

PROCESS CONTROL METHOD FOR LITHOGRAPHICALLY PROCESSED SEMICONDUCTOR DEVICES

CROSS-REFERENCE TO RELATED APPLICATIONS

None.

STATEMENT REGARDING FEDERALLY SPONSORED RESEARCH OR DEVELOPMENT

None.

BACKGROUND OF THE INVENTION

Field of the Invention

The present invention relates to the manufacture of semiconductor devices like volatile and non-volatile memory devices, logic circuits, microprocessors, power semiconductor devices and flat panel devices, wherein an exposure process transfers patterns into photoresist layers on the semiconductor wafers. The exposure process may use APC (advanced process control) for determining exposure parameters for a current exposure on the basis of metrology results from previously exposed semiconductor wafers. The present invention further relates to a wafer fabrication assembly that includes an exposure tool assembly.

Brief Description of the Related Art

During a fabrication process for semiconductor devices, various physical parts of functional elements such as transistors, diodes, capacitors, resistors, and wiring connections are formed in and on a semiconductor substrate, e.g., as doped regions in the semiconductor substrate and in layers deposited on a processed surface of the semiconductor substrate. The physical parts may be formed layer-by-layer by combining deposition of one or more layers on the processed surface and using patterning processes to transfer a certain pattern into the layers, wherein the patterning processes locally modify or remove portions of the concerned layer, e.g. by etching. Fluctuations in the patterning process result in deviations from target dimensions and may adversely affect process yield or can cause a comparatively wide spread of parameters of the finalized semiconductor devices.

Patterning by photomasking includes deposition of a photoresist layer on a processed surface of a semiconductor wafer. An exposure process projects a reticle pattern of a photomask into the photoresist layer, wherein in the photoresist layer a photoactive component is modified selectively in the exposed portions with respect to the unexposed portions such that after exposure the photoresist layer contains a latent image of the reticle pattern. A development process selectively removes the modified portions or the non-modified portions. The developed resist layer may be used as etch mask or as implant mask.

Physical dimensions of the resist patterns depend, inter alia, on the exposure dose and a defocus value. The exposure dose represents the energy of the exposure radiation which is used to expose the photoresist layer with a specific pattern. The defocus indicates a distance between a wafer surface and a focal plane of the exposure radiation. Physical dimensions of certain critical patterns in the photoresist layer may be measured and compared with target dimensions. An APC may adjust exposure dose and/or defocus of the next exposure as a function of the result of the measurement for the critical dimensions.

There is a need for improved uniformity of physical dimensions of photoresist patterns across a wafer, e.g., within-wafer uniformity, and among wafers, e.g., wafer-to-wafer uniformity at low effort and/or for reduced metrology effort without adverse impact on within-wafer and wafer-to-wafer uniformity.

SUMMARY OF THE INVENTION

In a preferred embodiment, the present invention is an advanced process control method. The method comprises exposing, by using an exposure tool assembly, photoresist layers coating semiconductor substrates to an exposure beam, wherein for each exposure a current exposure parameter set comprising at least a defocus value and an exposure dose is used; developing the exposed photoresist layers to form resist patterns; measuring feature characteristics in the resist pattern and/or a substrate pattern derived from the resist pattern, and updating the current exposure parameter set in response to deviations of the measured feature characteristics from target feature characteristics; estimating de-corrected feature characteristics of hypothetical resist patterns formed without updating the exposure parameter set; and at least one of (i) changing a measurement strategy for the feature characteristics in response to information obtained from the de-corrected feature characteristics and (ii) updating the current exposure parameter set in response to information obtained from the de-corrected feature characteristics. The method may further comprise exposing, by using the exposure tool assembly, a photoresist layer coating a semiconductor substrate to an exposure beam, wherein the updated exposure parameter set is used. The method may still further comprise updating the current exposure parameter set in response to information obtained from the de-corrected feature characteristics and from wafer context information, wherein the wafer context information contains information about process history of the semiconductor substrates. The updating the current exposure parameter may exclusively consider semiconductor substrates assigned to a substrate group, wherein the semiconductor substrates assigned to the substrate group share at least one common parameter in the wafer context information and wherein the substrate group comprises a true subset of the semiconductor substrates. De-corrected feature characteristics of the semiconductor substrates assigned to the substrate group may show a correlation that differs from a correlation among the de-corrected feature characteristics of all the semiconductor substrates.

Still further, the method may comprise changing the measurement strategy by modifying a sampling plan that comprises position information about sampling points on a surface of the semiconductor substrates, wherein the feature characteristics are measured at the sampling points. The method also may comprise determining first model coefficients of a wafer model on the basis of an original sampling plan including a first number of sampling points, determining second model coefficients of the wafer model on the basis of a true subset of the sampling points, and replacing the original sampling plan with a new sampling plan comprising the true subset of the sampling points if a deviation between the first and second model coefficients is below a pre-defined threshold.

The resist pattern and/or the substrate pattern may comprises a plurality of resist features and the feature characteristics comprise at least one of a diameter of a circular resist feature, a side wall angle of a resist feature, a height dimension of a resist feature, a length of a short axis of a non-circular resist feature, a length of a long axis of a non-circular resist feature, a line width of a stripe-shaped resist feature, a width of a space between resist features, an area of a resist feature and a line edge roughness of a resist features.

In another embodiment, the present invention comprises a wafer fabrication assembly. The assembly has an exposure tool assembly configured i) to expose photoresist layers coating semiconductor substrates to an exposure beam according to a current exposure parameter set and ii) to form resist patterns from the exposed photoresist layers, a metrology unit configured to measure feature characteristics of at least one of the resist pattern and a substrate pattern derived from the resist pattern, an APC unit configured to update the exposure parameter sets in response to deviations of the measured feature characteristics from target feature characteristics, and a calculation unit configured to estimate de-corrected feature characteristics of hypothetical resist patterns formed without updating the exposure parameter sets. The calculation unit may be configured to at least one of (i) changing a measurement strategy for the feature characteristics and (ii) updating the current exposure parameter set in response to information obtained from the de-corrected feature characteristics. The calculation unit may be configured to update the current exposure parameter set in response to information obtained from the de-corrected feature characteristics and from wafer context information, wherein the wafer context information contains information about process history of the semiconductor substrates. The calculation unit may be configured to update the current exposure parameter exclusively on the basis of semiconductor substrates assigned to a substrate group, wherein the semiconductor substrates assigned to the substrate group share at least one common parameter in the wafer context information and wherein the substrate group comprises a true subset of the semiconductor substrates. De-corrected feature characteristics of the semiconductor substrates assigned to the substrate group may show a correlation that differs from a correlation among the de-corrected feature characteristics of all the semiconductor substrates.

The wafer fabrication assembly may further comprise a data interface connecting the calculation unit and the APC unit, wherein the APC unit is configured to update the exposure parameter sets in response to information received from the calculation unit.

The calculation unit may be configured to determine first model coefficients of a wafer model on the basis of an original sampling plan including a first number of sampling points, to determine second model coefficients of the wafer model on the basis of a true subset of the sampling points of the original sampling plan, and to output information descriptive for the first and second model coefficients. The calculation unit may be configured to simulate de-corrected feature characteristics of hypothetical resist patterns for alternative settings for at least one of a sampling plan, an automated process control and a wafer model.

Still other aspects, features, and advantages of the present invention are readily apparent from the following detailed description, simply by illustrating a preferable embodiments and implementations. The present invention is also capable of other and different embodiments and its several details can be modified in various obvious respects, all without departing from the spirit and scope of the present invention. Accordingly, the drawings and descriptions are to be regarded as illustrative in nature, and not as restrictive. Additional objects and advantages of the invention will be set forth in part in the description which follows and in part will be obvious from the description, or may be learned by practice of the invention.

BRIEF DESCRIPTION OF THE DRAWINGS

For a more complete understanding of the present invention and the advantages thereof, reference is now made to the following description and the accompanying drawings, in which.

DETAILED DESCRIPTION

Figure 1:
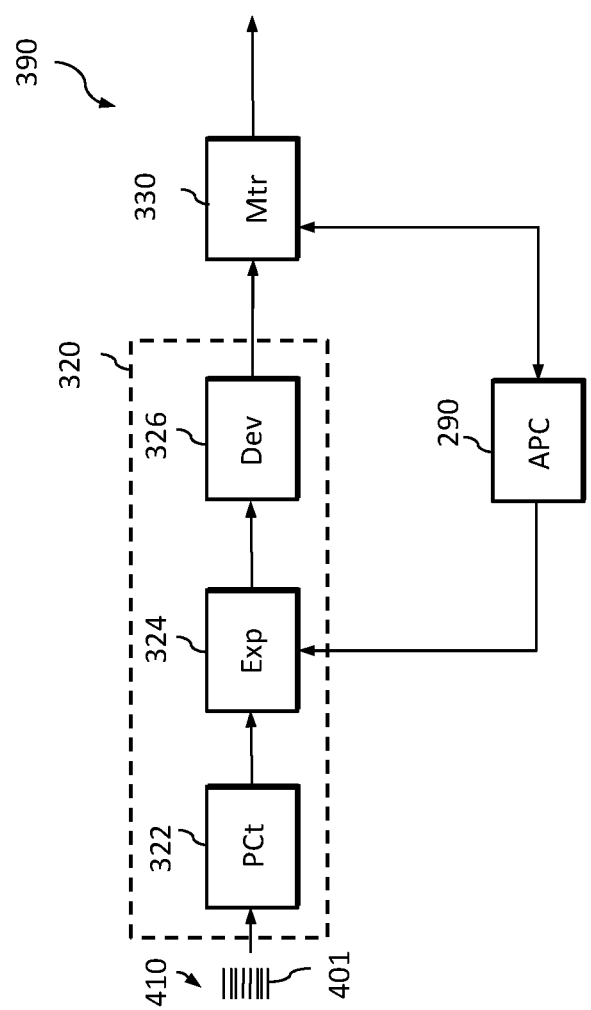
FIG. 1 is a schematic block diagram of a section of a semiconductor device fabrication assembly including an advanced process control unit for controlling exposure parameters according to a reference example for illustrating background useful for understanding of the embodiments of the present invention.

FIG. 1 shows a portion of a conventional semiconductor device fabrication assembly 390 with an exposure tool assembly 320 that includes a coater unit 322, an exposure unit 324 and a developer unit 326. A plurality of input wafer lots 410 of pre-processed semiconductor substrates is successively supplied to the semiconductor device fabrication assembly 390. The semiconductor substrates may be semiconductor wafers, glass substrates with semiconductor structures formed thereupon or SOI (semiconductor-on-insulator) wafers, by way of example. Irrespective of their type, the semiconductor substrates are referred to as wafers 401 in the following.

The number of wafers 401 per wafer lot 410 is typically up to 25. The wafers 401 of the same wafer lot 410 may be subjected to the same processes for forming the same electronic circuits. For example, the wafers 401 of each wafer lot 410 may be successively supplied to different process units of the same type, wherein process units of the same type apply the same process. Alternatively, the wafers 401 may be successively supplied to the same process units, wherein each process unit may include one or more sub-units at which some of the wafers 401 of each wafer lot 410 may be processed in parallel.

In the example of FIG. 1, the wafers 401 of the wafer lot 410 are supplied to the coater unit 322 of the exposure tool assembly 320. The coater unit 322 coats the wafers 401 with a photoresist layer or layer system with or without antireflective coating. The coater unit 322 may include a spinner unit that dispenses a resist material on a wafer surface and uniformly distributes the resist material by rotating the wafer 401. The coater unit 322 may include a heating facility for evaporating a portion of the solvents in the photoresist. The wafers 401 coated with at least the photoresist layer are transferred to the exposure unit 324.

The exposure unit 324 generates an exposure beam that transfers a target pattern into the photoresist layer, wherein the exposure beam may activate a photoactive component of the photoresist layer selectively in exposed portions. The exposure beam may be a beam of electromagnetic radiation or a particle beam. For example, the exposure beam is an electron beam that may scan the photoresist layer, wherein an intensity modulation or blanking of the light beam may generate the target pattern. According to another embodiment the exposure beam includes light or electromagnetic radiation with a wavelength shorter than 365 nm, e.g., 193 nm or less, wherein the electromagnetic radiation passes a reticle or reflects at a reticle and images the reticle pattern into the photoresist layer.

In the portions of the photoresist layer exposed by the exposure beam the photoactive component affects a polymerization of a previously not-polymerized compound or a de-polymerization of a previously polymerized compound.

Exposure of one wafer 401 may include one single exposure of the complete processed surface or may include a plurality of exposures in neighboring exposure fields on the processed surface, wherein the same pattern is imaged into each exposure field. Each exposure is defined by an exposure dose of the exposure radiation and by a defocus value that indicates a distance between the processed surface and a focal plane of the exposure radiation. Defocus and/or exposure dose may differ for different exposure fields on the same wafer 401, between different wafers of the wafer lot 410 and/or the different wafer lots 410. The wafers 401 with the exposed photoresist layers are transferred to the developer unit 326.

The developer unit 326 removes the exposed portions of the photoresist layer with respect to the unexposed portions or the unexposed portions with respect to the exposed portions. The developer unit 326 may include a heating chamber for a post-exposure bake and uses different dissolving rates of exposed and unexposed portions of the photoresist layer to selectively dissolve either the exposed portions with respect to the unexposed portions or vice versa. The developer unit 326 may include a heating chamber for evaporating remaining solvents and for chemically modifying the developed resist layer, e.g., in order to harden the developed resist layer or to improve adhesion of the developed resist layer on the wafer surface. The developed resist layer forms a resist pattern that includes a plurality of resist features.

A metrology unit 330 may measure feature characteristics of critical resist features of the resist pattern at sampling points. The metrology unit 330 may be integrated part of the exposure tool assembly 320 or the wafers 401 may be transferred to a remote metrology unit 330. The feature characteristics include physical dimensions of the critical resist features. The sampling points are locations on a wafer defined in a sampling plan. The metrology unit 330 may obtain information on the feature characteristics by OCD (optical critical dimension) scatterometry, inspection of images obtained by SEM (scanning electron microscopy) and inspection of images obtained by optical microscopy, by way of example.

The feature characteristics of critical resist features may include physical dimensions such as diameters of circular resist features, lengths of short axes and long axes of non-circular resist features, line widths of stripe-shaped resist features, widths of spaces between resist features, side wall angles of resist features, areas of resist features and other properties such as line edge roughness of resist features, by way of example. In the following the abbreviation "CD" includes all sorts of feature characteristics and is not limited to the widths of lines and spaces of critical resist features and the area of critical resist features.

A post-exposure process may use the resist pattern, e.g., as etch mask for forming grooves and trenches in the semiconductor substrate, as implant mask or as a mask for other modification processes.

An APC unit 290 receives the measured CD of the measured wafers at selected locations defined in the sampling plan. Based on the CD measured on one or more preceding wafers processed at the same exposure tool assembly 320 or at other exposure tool assemblies the APC unit 290 adjusts exposure dose and/or defocus in the exposure unit 324 for each exposure field, each wafer and/or each wafer lot individually.

Figure 2:
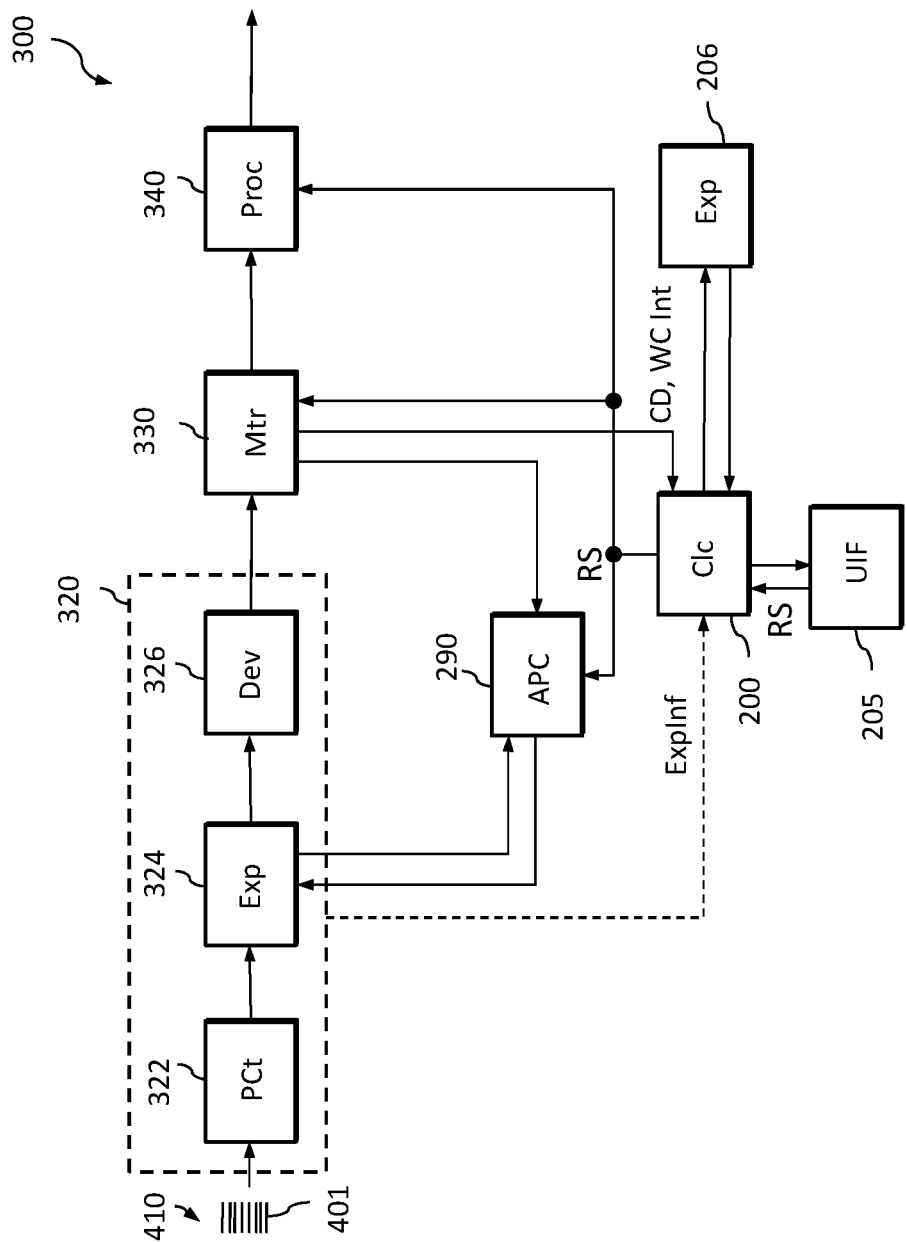
FIG. 2 is a schematic block diagram of a portion of a semiconductor device fabrication assembly including a calculation unit for estimating de-corrected feature characteristics of hypothetical structures formed without updating the exposure parameters according to an embodiment of the present invention.

FIG. 2 illustrates a wafer fabrication assembly 300 that includes means for determining exposure parameters, metrology settings and advanced process control settings for lithographically processed semiconductor devices. The wafer fabrication assembly 300 may include an exposure tool assembly 320 and a metrology unit 330 with the functionality as described with reference to FIG. 1.

An APC unit 290 may determine an exposure parameter set for the current exposure on the basis of measured CD received from the metrology unit 330. The exposure parameter set may include dose/focus correction data, e.g., correction values for the focus, correction values for the exposure dose, or correction values for both the focus and the exposure dose. The APC unit 290 may further consider previous correction data of a pre-determined number of previous exposures multiplied with specific weight coefficients, respectively. In the absence of other information received from outside, the APC unit 290 outputs new dose/focus correction data to the exposure tool assembly 320.

The wafer fabrication assembly 300 further includes a calculation unit 200 that receives information about specific feature characteristics of the measured wafers. For example, the metrology unit 330 or an MES (manufacturing execution system) that receives and administers measurement data obtained by a plurality of metrology units may transfer the CD as defined above to the calculation unit 200. In addition, the calculation unit 200 may receive wafer context information WCI that identifies the wafer 401 from which the CD is obtained. The wafer context information WCI may include parameters identifying source, type and parameters of the wafer 401, process tools and process units at which the wafer 401 has been processed, e.g., the reticle used in the exposure tool assembly 320, process conditions the concerned wafer has been subjected to, identifiers for process gases and process fluids the concerned wafer has been exposed to, as well as chronical information containing date and time of previous processes, by way of example.

The calculation unit 200 also receives and/or holds exposure information usable for process correction in the exposure tool assembly 320, e.g., the previously applied exposure dose, focus, previous dose/focus correction data and/or the temperature profile of a post-exposure bake. The exposure information usable for process correction may be included in the wafer context information WCI or may be directly transmitted from the exposure tool assembly 320 to the calculation unit 200.

A primary stage of the calculation unit 200 may determine a dose and focus error for the current exposure on the basis of the measured CD received from the metrology unit 330 and the exposure information. The exposure information may include the exposure parameters of one or more preceding exposures, the dose and focus errors of one or more preceding exposures and/or focus data obtained by an on-product focus measurement, wherein in case the calculation unit 200 receives data obtained by on-product focus measurement the focus error may be zero.

For determining the dose and focus error, the primary stage of the calculation unit 200 may use a physical model describing a relation between CD, exposure dose, and focus. From the measured CD, the physical model, which may be defined by a base function and coefficients, i.e., a polynomial model, may obtain exposure dose and/or defocus values valid for the sampling points from which the measured CD has been obtained.

A secondary stage of the calculation unit 200 may calculate the alternative, de-corrected feature characteristics of hypothetical resist patterns, which would be formed without any update of the exposure parameter set. In other words, the calculation unit 200 calculates the CD for the case any advanced process control is omitted. According to an embodiment the secondary stage may retrospectively calculate optimum dose and optimum focus values for previously processed wafers.

By estimating hypothetical de-corrected feature characteristics that would result from the exposure without applying the update procedure for defocus and/or exposure dose, the calculation unit 200 may help to calculate and to analyze the parameters of all processes from exposure up to at least a first post-exposure process unit 340 while at the same time a basic advanced process control for the exposure is still active and the processed wafers 401 meet the process tolerances to the usual degree. The calculation unit 200 may allow determining process correction values and CD uniformity using different wafer models, wafer context information, APC settings and/or adjustments in the sampling plan without temporary by-pass of the advanced process control, such that wafer yield remains unaffected and no wafers are lost due to the absence of advanced process control.

To this purpose the results RS obtained by the secondary stage of the calculation unit 200 may be transmitted to an expert system 206, to a user interface 205 that visualizes the results for a human operator (user), to a post-exposure process unit 340 or to the APC unit 290. The results of the secondary stage of the calculation unit 200 may be used to affect wafer processing, e.g., by modifying the setting of the advanced process control or by a re-definition of the wafer model, by controlling a post-exposure process unit 340 in a way to compensate for a parameter drift or by changing a measurement strategy, e.g., by modifying a sampling plan used by the metrology unit 330.

For example, based on the information obtained from the calculation unit 200 the sampling plan used by the metrology unit 330 may be modified by skipping sampling points that have least impact on the determination of the model coefficients of a model describing a CD distribution across a complete wafer surface in terms of one or more polynomials Alternatively or in addition, alternative defocus/dose correction parameters may be obtained in a way that deviations of the feature characteristics from target values are smoothed or minimized. To this purpose the de-corrected CD may be searched for trends specific for certain parameters of the wafer context information. The alternative dose/focus correction data may be transmitted to the APC unit 290 where the revised defocus/dose correction parameters may overwrite conventionally derived dose/focus correction values for the next exposure.

Simulation of the behavior of the wafer fabrication assembly 300 in combination with simulation of results for other parameter settings at the user interface 205 allows for differentiating between different sources or circumstances for CD deviations. Tendencies and trends of parameter fluctuations can be evaluated more precisely and without interference with other effects. In addition, the impact of different parameter settings on specific feature characteristics may be evaluated to decide which feature characteristics at the original sampling points are most critical.

Figure 3:
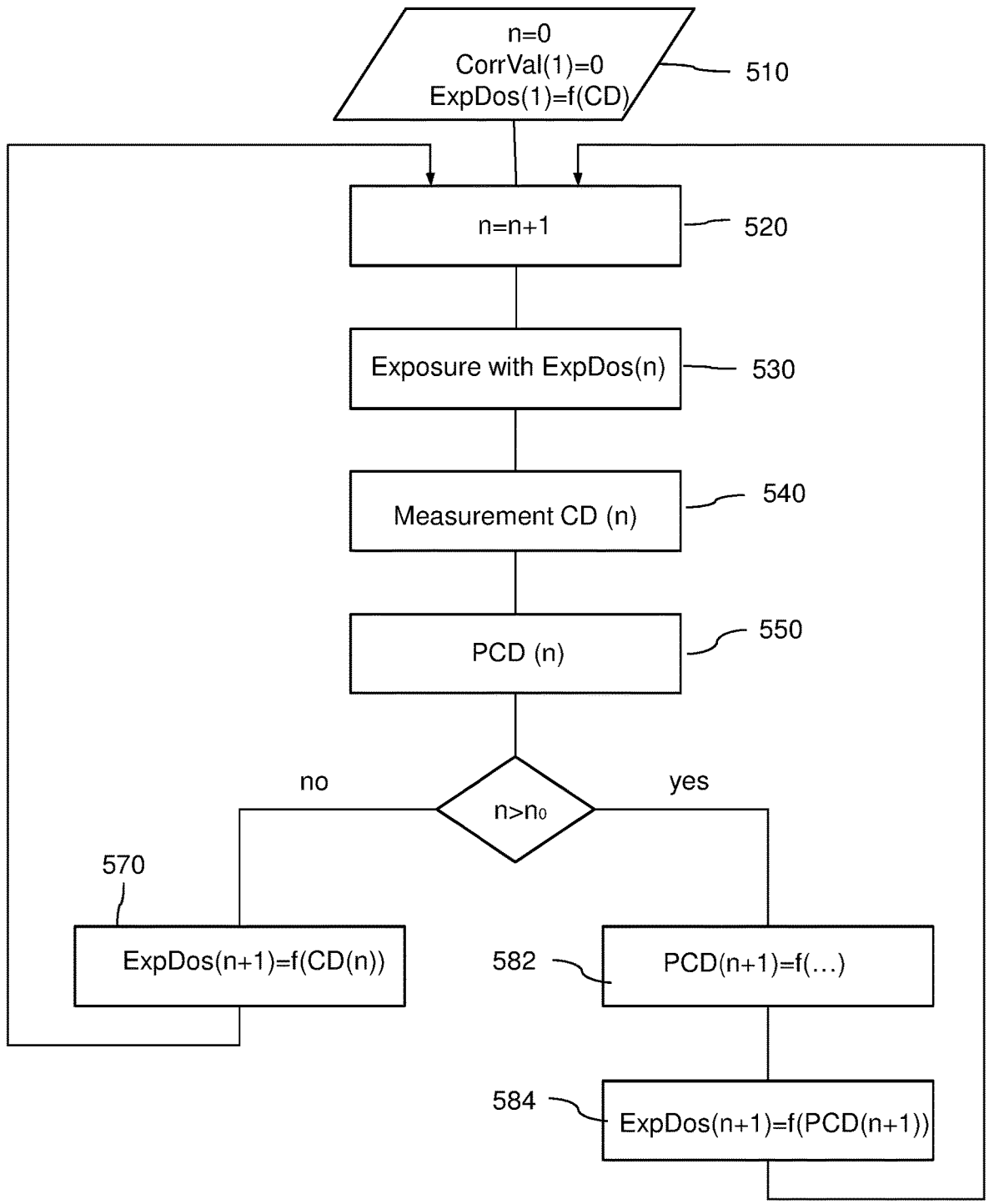
FIG. 3 is a schematic flow chart illustrating a method for advanced process control according to an embodiment of the present invention concerning an update of exposure parameters.

FIG. 3 illustrates details of a simulation carried out in the course of a method that modifies the exposure dose for a current exposure on the basis of an estimated CD predicted for the current exposure from the de-corrected CD of previous exposures. The simulation may be executed by the calculation unit 200 of FIG. 2. For simplicity, the simulation refers to an embodiment considering only the exposure dose. The simulation may be applied to defocus, to a combination of defocus and exposure dose and to further parameters and parameter combinations as well.

An initialization step 510 initializes the values for a counter n, which may count single wafers or wafer lots, a correction value CorrVal(1) for the first wafer or wafer lot and the exposure dose ExpDos(1) for the first exposure, wherein the first exposure dose may be exclusively derived from the target CD and the apparatus parameters. A counter step 520 may increment the counter n by one. An exposure tool exposes the wafer or the wafers assigned to the counter value n with the initial exposure dose in an exposure step 530. At least one critical dimension on a single wafer or a plurality, e.g., all wafers assigned to the same lot is obtained by a measurement step 540. From the measured CD, an estimation step 550 estimates de-corrected critical dimensions CD(n) by adding or subtracting, from the measured CD, a portion resulting from a correction dose, wherein for n=1 the estimated CD(1) is equal to the measured CD.

Up to a predefined number $n_0$ of wafers or wafer lots a relaxed APC setting may calculate the exposure dose for the next single wafer or wafer lot on the basis of one or more previously measured critical dimensions CD(n), CD(n−1) in APC step 570.

In case the number of measurements exceeds the predefined number no and sufficient information is contained in the estimated de-corrected critical dimensions CD(1), . . . CD(n), a predictor step 582 may calculate a hypothetical critical dimension PCD(n+1) for the next single wafer or wafer lot as a function of the previously estimated de-corrected CD and the alternative dose corrections. To this purpose the predictor step 582 may interpret wafer context information concerning the current and the previous wafers for context. A correction step 584 may determine the alternative dose corrections for the next exposure on the basis of the previously estimated CD.

The following tables illustrate the embodiment of FIG. 3 by means of an example. A target CD of 30 nm results from the exposure of a given reticle with an exposure dose of 25 mJ/cm$^2$. Close to the exposure dose of 25 mJ, a fluctuation in exposure dose of +1 mJ/cm$^2$ results in a reduction of the CD of 1 nm.

In the example of table 1, the first wafer lot exposure with an exposure dose of 25 mJ/cm$^2$ results in a measured CD of 32 nm that is a deviation of +2 nm from the target CD. Taking into account that one additional mJ/cm$^2$ results in a line reduction of 1 nm according to the model describing the relation between dose and CD, the APC increases exposure dose by a correction dose of +2 mJ/cm$^2$ in order to reduce the CD by 2 nm to meet the target CD. But due to process variations as discussed above, the mean measured CD for the second wafer lot may again deviate from the expected 30 nm and may be, for example 30.5 nm. For exposure of the next wafer lot the APC may further increase the correction dose by 0.5 mJ/cm$^2$ for cancelling out the remaining CD deviation of +0.5 nm. Again further process fluctuations affect that the mean measured CD for the third wafer lot is 29.7 nm such that for the fourth wafer lot the correction dose is reduced by 0.3 mJ/cm$^2$.

TABLE 1

| Lot number | Exposure Dose [mJ/cm$^2$] | Measured CD [nm] | Correction Dose [mJ/cm$^2$] |
|---|---|---|---|
| 1 | 25 | 32 | +2 |
| 2 | 27 | 30.5 | +0.5 |
| 3 | 27.5 | 29.7 | −0.3 |
| 4 | 27.2 | . . . | . . . |

Table 2 refers to an example how de-corrected CD values may be estimated on the bases of the measured CD and the correction CD resulting from the correction dose. For the first lot, the de-corrected CD is equal to the measured CD, since no correction dose has been used to generate a correction CD. For the second lot a correction dose of 2 mJ/cm$^2$ has been used that results in a decrease of 2 nm in line width. Hence, without correction dose, the actual line width would have been 32.5 nm instead of 30.0 nm. For the third lot, the measured CD is 29.7 nm but the correction dose, which is in total 2.5 nm, has reduced line width by 2.5 nm such that the de-corrected CD is 32.2 nm.

TABLE 2

| Lot number | Measured CD [nm] | Correction Value CD [mJ/cm$^2$] | De-corrected CD [nm] |
|---|---|---|---|
| 1 | 32 | | 32 |
| 2 | 30.5 | −2 | 32.5 |
| 3 | 29.7 | −2.5 | 32.2 |
| 4 | . . . | . . . | . . . |

The de-corrected CD may be searched for trends, periodicities or context dependencies or the absence of trends and periodicities or context dependencies.

Figure 4:
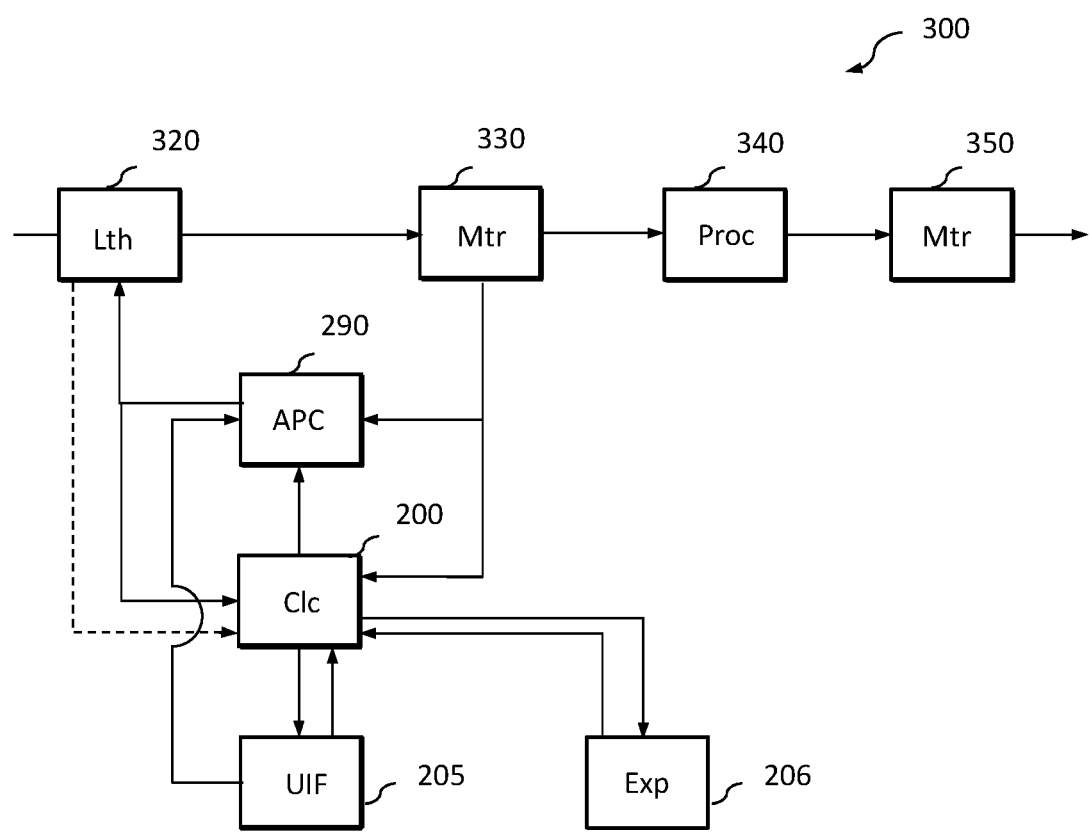
FIG. 4 is a schematic block diagram of a portion of a semiconductor device fabrication assembly including a calculation unit according to an embodiment concerning control of correction data for an exposure tool assembly.

FIG. 4 refers to a wafer fabrication assembly 300 with a calculation unit 200 used for improving correction values for exposure dose and/or defocus in an exposure tool assembly 320. A metrology unit 330 may obtain CD from wafers 401 and transmits the CD to an APC unit 290 and to a calculation unit 200.

The metrology unit 330 transmits the measured CD to the calculation unit 200. The calculation unit 200 may use the measured CD directly for obtaining first a model describing a CD distribution across a complete wafer surface in terms of one or more polynomials and for calculating the de-corrected feature characteristics of hypothetical resist patterns. According to another embodiment the calculation unit 200 uses a relationship between CD and exposure dose and defocus for obtaining the dose and focus errors and uses the dose and focus errors or dose and focus settings in the following, e.g. for determining model coefficients of a model that describes focus and dose error or optimum dose and/or optimum focus for each point of the model such that the model coefficients do not depend on the type of CD.

APC unit 290 and calculation unit 200 may be assigned to different hardware components, e.g., controllers, servers, computers connected through data transmission interfaces and/or to different software modules exchanging data through a data interface.

For example, the APC unit 290 may include a controller unit running a program for conventional focus/dose control and including an interface for receiving at least one of i) an alternate parameter setting for determining improved focus/dose control parameters and ii) improved focus/dose control parameters for overwriting conventionally obtained ones before transfer of the focus/dose control parameters to the exposure tool assembly 320.

The calculation unit 200 may be an additional device, e.g., a further controller or an additional software module for computer running a program in addition to the advanced process control in the APC unit 290, wherein the results obtained by the calculation unit 200 may affect a change in the parameter setting of the APC unit 290, a replacement of the focus/dose correction values in the APC unit 290 or may be directly transmitted to the exposure tool assembly 320. According to another embodiment the APC unit 290 is one of several modules or stages integrated in the calculation unit 200, wherein the calculation unit 200 may completely replace a conventional APC unit 290.

The APC unit 290 may perform conventional ("relaxed") control of exposure dose and/or focus as long as the APC unit 290 does not receive other information e.g., from the calculation unit 200 or from a user interface 205. In case the APC unit 290 receives enhanced correction data for exposure dose and defocus, the APC unit 290 forwards the enhanced correction data instead of the relaxed correction data. According to another embodiment the APC unit 290 may receive alternative parameter settings, e.g., weight settings for previous CDs or previous correction values and overwrites the previous parameter setting with the received alternative parameter setting.

The calculation unit 200 calculates de-corrected CD of hypothetical structures in the resist pattern, which would be formed in the resist pattern without any update of the exposure parameter set, and may transmit the de-corrected CD to a user interface 205 and/or to an external expert system 206. Alternatively or in addition, the calculation unit 200 may evaluate the de-corrected CD in an internal expert stage.

The user, the expert system 206 or the expert stage of the calculation unit 200 may link the de-corrected CD with the wafer and/or wafer lot context information and may search the parameters of the wafer context information for correlations between the respective parameter and the de-corrected CD values. If a correlation between a parameter of the wafer context information and the de-corrected CD values is found, the user, the expert system 206 or the expert stage prompts the calculation unit 200 to estimate enhanced correction values only on the basis of such previous exposures that concern the same parameter of the wafer context information.

For example, if the user, the expert system 206 or the expert stage identifies a certain CD trend for a parameter identifying a specific coater unit that significantly differs from CD trends of other coater units, the user, the expert system 206 or the expert stage may prompt the calculation unit 200 to use a different parameter setting, which uses only the exposure history from wafers processed at the same coater unit, to determine the enhanced CD correction values.

A simulation stage of the calculation unit 200 may simulate the effect of the different parameter setting on the CD before the different parameter setting is actually used to determine the focus/dose correction values. The result of the simulation may be transmitted to the user interface 205 where the user may approve to the different parameter setting.

After approval to the different parameter setting, the calculation unit 200 or the user may update the parameter setting in the APC unit 290. According to another embodiment the calculation unit 200 may transmit focus/dose correction values obtained with the new parameter setting directly to the exposure tool assembly 320 such that the APC unit 290 is by-passed.

From the measured CD and from the calculated exposure dose and/or defocus of the sampling points on the wafer 401, a secondary stage of the calculation unit 200 may determine coefficients of a model for estimating dose/focus in areas on the wafer 401 not directly covered by the sampling points and/or for separating a possible systematic part from a random part. The model may be or may include a wafer-scale model that describes a dose/focus distribution across a complete wafer surface in terms of one or more polynomials, e.g., an odd and an even Zernike polynomial, Legendre polynomials and/or in terms of radial basis functions determined in a TPS (thin plate spline) technique.

The measured CD delivers values only at the sampling points. A modelling algorithm calculates model coefficients, e.g., for a Zernike or a Legendre polynomial that matches best with the basic values, i.e., the measured CD at the sampling points. With all model coefficients of the polynomial identified, the polynomial can be evaluated to estimate the dose/focus correction data for each point on the wafer surface.

The model may also include one or more models of single exposure fields (field-fine model) or a field model that summarizes a plurality of the exposure fields of a wafer 401, e.g., all exposure fields of a wafer 401.

The model provides the dose/de-focus for a dense grid of points across the complete wafer surface. The order of the secondary stage and the primary stage may be changed and both stages may operate in parallel or one after another.

The new setting may concern new coefficients of the model for estimating the relevant CD information for an exposure field. For example, the new setting may change the order of at least one of the model polynomials, e.g., from an n-th order Zernike polynomial to an (n−m)th or (n+m)th order Zernike polynomial. The new setting may also change the model type, e.g., from a model described by a Zernike polynomial to a Legendre model. The effect of the new model may be simulated by means of the simulation stage of the calculation unit 200 and visualized at the user interface 205.

By calculating the de-corrected CD of hypothetical structures that would have been formed on the same wafer in the absence of an APC, better CD correction values can be searched for while at the same time a basic advanced process control for the exposure is still active and the processed wafers 401 meet the process tolerances to the usual degree. On the other hand, the knowledge about the de-corrected CD allows for differentiating, e.g., between different tools or chambers at which the wafers 401 are processed in parallel.

Exploratory data analysis (EDA) may be used to analyze the de-corrected CD in order to summarize their main characteristics, e.g., with visual methods, wherein the EDA may use a statistical model.

A further metrology unit 350 may measure dimensions of critical substrate features (substrate CD). The calculation unit 200 may use at least one of the substrate CD and the resist CD as measured CD.

Figure 5:
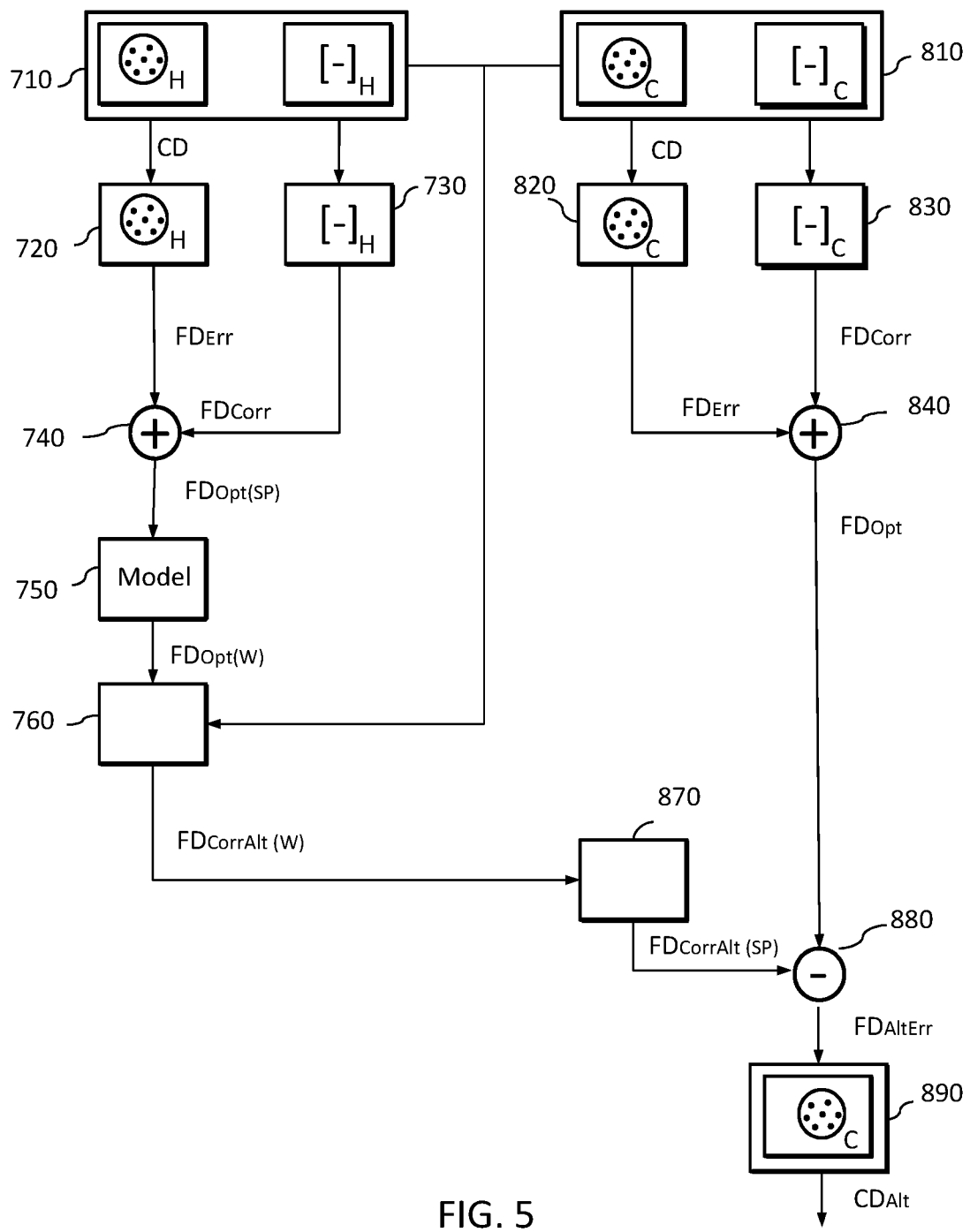
FIG. 5 is a block diagram schematically illustrating an advanced process control method according to an embodiment.

According to an embodiment the calculation unit 200 and the APC unit 290 of FIG. 4 may cooperate to execute the advanced process control method illustrated in FIG. 5, wherein each functional block of FIG. 5 corresponds to a method step carried out in one of the units described in FIG. 4, e.g., as part of a program code executed in a controller or server.

The functional blocks in the right row concern a wafer (current wafer) inspected at a certain point in time and to current wafer data obtained from and assigned to the current wafer. The current wafer data may contain current CD measurements at predefined measurement sites and data derived from the current CD measurements, e.g., current defocus and error data. The current wafer data may include wafer context information pertinent for the current wafer, information about the applied defocus and error correction, and others. The measurement sites may be defined in a sampling plan.

The functional blocks in the left row concern previously processed and inspected wafers (historical wafers) inspected prior to the current wafer and to historical wafer data obtained from and assigned to the historical wafers. The historical wafer data may contain historical CD measurements and historical defocus and dose data at the predefined measurement sites. The historical wafer data may further include wafer context information, e.g., information identifying process units the wafer has been processed at and process conditions the wafer has been subjected to.

A first step 710 stores and makes available the results of the historical CD measurements at the measurement sites and the historical exposure data for a plurality of historical wafers. A second step 720 converts the historical CD measurements into an exposure error that describes the deviation of the CD measurement from a target CD in terms of defocus and dose error. The second step 720 may use a polynomial model linking the CD deviation from a target value with a defocus and dose error that causes the CD deviation. The defocus and dose error may be exclusively a defocus, may be exclusively a dose error or may include both a defocus and a dose error. The defocus and dose error describe the residual defocus and dose error of the historical wafers.

A third step 730 calculates the effects of the historical process corrections at the measurement sites. The historical process corrections correspond to the focus and dose corrections actually applied for each historical wafer and may form another instance of de-corrected feature characteristics as discussed above.

For each CD measurement site on a historical wafer, a fourth step 740 adds up the residual defocus and dose error determined in the second step 720 with the actually applied defocus and dose for the same historical wafer to obtain the optimum focus and/or optimum dose. The optimum focus and optimum dose are retrospectively obtained values for which the exposure would have led to a minimum CD deviation, if the exposure had used them.

A fifth step 750 may determine coefficients for a model that provides the optimum focus or the optimum dose for a dense grid of points across a complete historical wafer. According to an embodiment the fifth step 750 may provide the coefficients for a first model that provides the optimum focus and the coefficients for a second model that provides the optimum dose for a dense grid of points across a complete historical wafer. Steps 710 to 750 may be repeated for a plurality of the historical wafers.

From the historical optimum focus and optimum dose values a sixth step 760 calculates alternative dose and error corrections that are derived exclusively from historical data. The sixth step 760 may use an EWMA (exponentially weighted moving average) approach for the historical optimum focus and optimum dose values. The EWMA approach may track an exponentially-weighted moving average of the historical optimum focus and/or optimum dose in time, wherein the approach weights the historical optimum focus and optimum dose values in geometrically decreasing order such that the most recent optimum focus and optimum dose values are weighted most highly while the most distant samples contribute only little.

For example, the sixth step 760 may predict the optimum dose $z_{n+1}$ for a next wafer, which may be the current wafer, by adding, to the optimum dose $z_n$ for the last historical wafer n, a weighted prediction error for the last historical wafer n, wherein the prediction error is the difference between the applied dose $x_n$ and the optimum dose $z_n$ as given in equation (1):

$$z_{n+1} = z_n + \lambda(x_n - z_n) \quad (1)$$

Equation (2) describes the optimum dose $z_{n+1}$ for the next wafer in terms of the historically applied dose values $x_1 \ldots x_n$:

$$z_{n+1} = \lambda x_n + (1-\lambda)\lambda x_{n-1} + \ldots + (1-\lambda)^{n-1}\lambda x_1 + (1-\lambda)^n x_0 \quad (2)$$

In equation (1) the weight parameter $\lambda$ satisfies the condition $0 \leq \lambda \leq 1$, wherein for $\lambda=0$ the EWMA approach takes the mean value $x_0$ of the historical optimum dose values $\lambda$ may take any value in a range between a lower limit and an upper limit, wherein the lower limit may be 0.05 or 0.1 and the upper limit may be 0.2 or 0.3, by way of example $\lambda$ may be close to the lower limit when the sample values are noisy and may be close to the upper limit when the sample values approximates at least for a number of subsequent samples definable functions.

Alternatively or in addition, the sixth step 760 may predict the optimum focus value for the next wafer or both the optimum dose value and the optimum focus for the next wafer.

The sixth step 760 may also use the historical wafer context information and wafer context information for the current wafer to select only a subset of the historical wafers for the determination of the alternative dose and error correction value. For example, the sixth step 760 may take into account only such historical wafers that are processed at the same stage of the same exposure tool as the current wafer. From the predicted optimum focus and optimum dose, the sixth step predicts alternative defocus and dose error corrections for the next wafer.

A seventh step 810 makes available the result of a CD measurement at the measurement sites of the current wafer n+1. An eight step 820 converts the current CD measurements into an exposure error that describes the deviation of the CD measurement from a target CD in terms of a defocus and dose error. For obtaining the defocus and dose error from the deviation of the CD measurement from the target CD, the eight step 820 may use the same polynomial model as the second step 720. The defocus and dose error describe the residual defocus and dose error of the current wafer.

A ninth step 830 calculates the effect of the previous process correction at the measurement sites. The previous process corrections correspond to the focus and dose corrections actually applied for the current wafer.

For each measurement site on the current wafer, a tenth step 840 adds up the residual defocus and dose error obtained in the eight step 820 and the actual defocus and dose error of the current wafer obtained in the ninth step 830 to obtain the optimum focus and dose correction for the current wafer, wherein the optimum focus and dose correction are retrospectively obtained exposure parameters at which the exposure would have led to a minimum CD deviation if the exposure had used the optimum exposure parameters.

An eleventh step 870 calculates the effects of the alternative focus and dose corrections obtained in the sixth step 760 at the measurement sites of the current wafer.

A twelfth step 880 obtains alternative focus and dose errors by calculating the difference between the effects of the alternative focus and dose corrections obtained from the historical wafers in the eleventh step 870 and the optimal dose and focus obtained for the current wafer in the tenth step 840. A thirteenth step 890 may convert the alternative focus and dose errors to alternative CD values.

Figure 6:
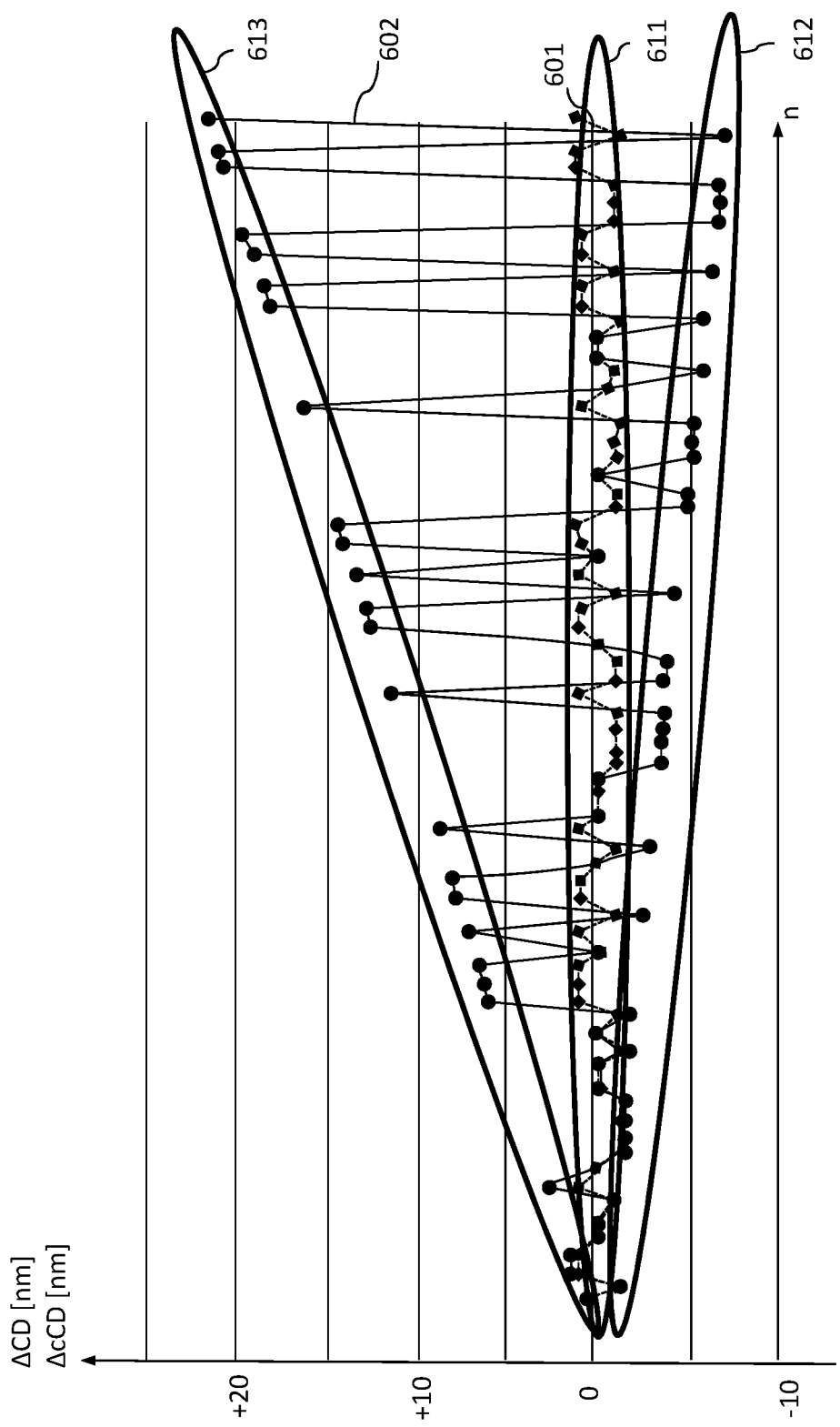
FIG. 6 is a diagram illustrating measured and de-corrected critical dimensions for illustrating effects of the embodiment of FIG. 4.

FIG. 6 illustrates the embodiment of FIG. 4 by way of an example that concerns process deviations induced by a coater unit. Line 601 connects the measured CD deviations ΔCD for n wafers and line 602 connects the de-corrected CD deviations ΔcCD for the same wafers. The de-corrected CD deviations can be assigned to three different context groups 611, 612, 613, wherein each context group includes a plurality of wafers. The de-corrected CD deviations of the wafers assigned to the first context group 611 show a correlation that differs from a correlation among the de-corrected CD deviations of the other wafers.

A user, an expert system or an expert stage of the calculation unit 200 may search the wafer context information of the concerned wafers to identify a common context for the wafers of a first context group 611, a common context for the wafers of a second context group 612 and a common context for the wafers of the third context group 613. If a common context for the wafers of the first context group 611 can be identified, the calculation unit may be prompted to determine correction values for a next wafer including the same parameter in the wafer context information exclusively from the previous correction values concerning the wafers of the first context group 611.

Figure 7:
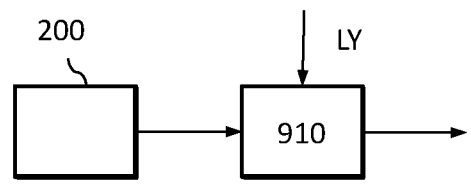
FIG. 7 is a block diagram schematically illustrating a method using information obtained by an advanced process control method according to a further embodiment.

In FIG. 7 a calculation unit 200 as discussed above is data-connected with a main unit 910 of an EDA (electronic design automation) system. The main unit 910 may be a computer running on a computer system or a server. The calculation unit 200 transmits information about the exposures carried out by a exposure tool assembly to the main unit 910. The main unit 910 further receives layout information specifying a pattern to be imaged into a photoresist layer. By convolution of the layout data with a model of the exposure beam, the main unit 910 obtains information about the energy distribution in the exposed photoresist layer such that the main unit 910 may simulate the effect of certain exposure parameters, defocus and dose deviations on dimensions of selected layout features.

Typically, the main unit 910 uses maximum values for defocus and dose error to identify critical layout features. By using actual defocus and dose errors made available by the calculation unit 200, the test for criticality becomes more precise and the EDA may concede layout features which otherwise would be marked as critical.

Figure 8:
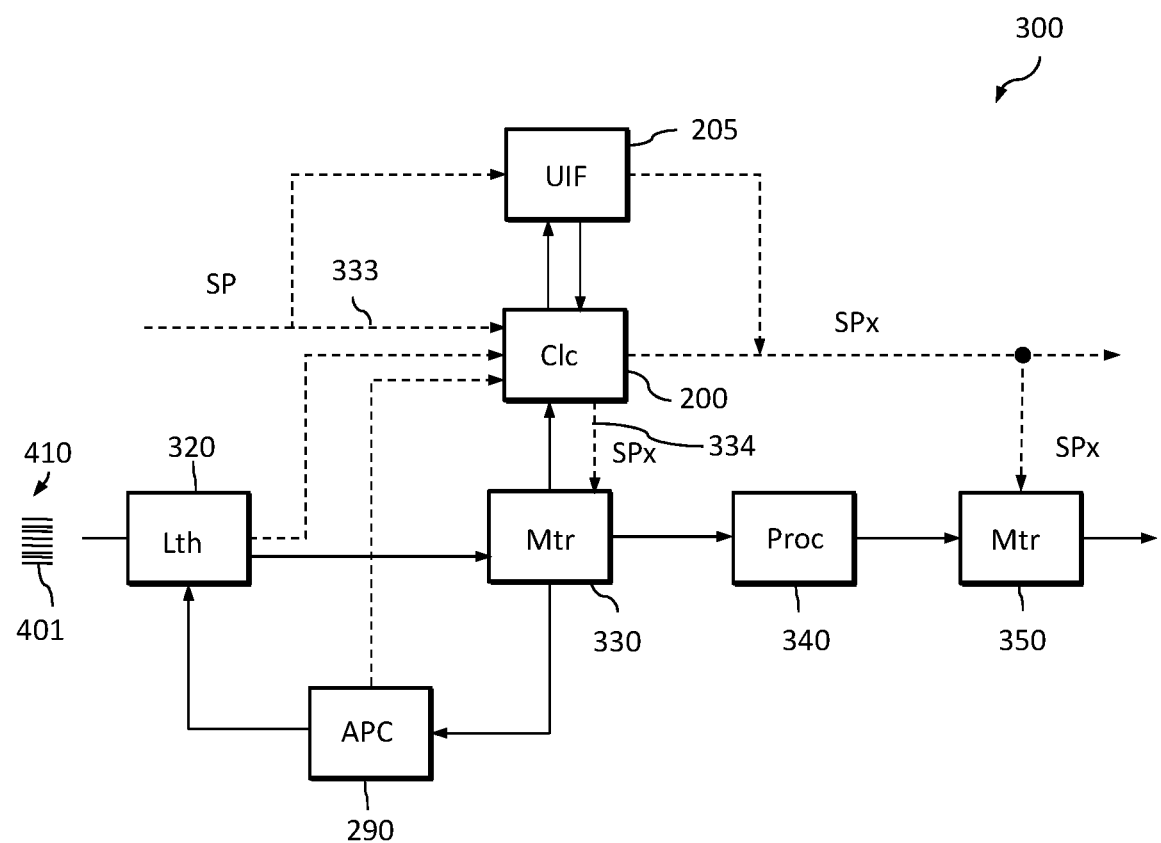
FIG. 8 is a schematic block diagram of a portion of a semiconductor device fabrication assembly including a calculation unit according to an embodiment concerning the modification of sampling plans.

FIG. 8 relates to an embodiment using the results of the calculation carried out by a calculation unit 200 to enhance the accuracy and/or efficiency of a metrology unit 330.

A wafer fabrication assembly 300 includes at least an exposure tool assembly 320, an APC unit 290, a metrology unit 330 and a post-exposure process unit 340 as described above.

A sampling plan 333 is transmitted to the metrology unit 330. The sampling plan 333 may include wafer identification information for identifying specific wafers 401 in the wafer lot 410 and further includes position information identifying metrology sites on the wafers 401 selected for inspection. The metrology sites may have circular, elliptical or rectangular shape. The size of the metrology sites depends on the measurement method. A diameter or edge length of the metrology sites may be about 100 μm for scatterometric methods and about 1 μm for measurements using electron microscopy or less than 1 μm.

The metrology unit 330 inspects the wafers 401 and obtains characteristic features about the concerned wafer 401 at the metrology sites identified in the sampling plan 333. The characteristic features may contain geometric dimensions such as height, width and/or length of a structure on a surface of the wafer 401 within the measurement area, e.g., a width of a line or a vertical extension of a step or a trench, a sidewall angle of a protrusion extending from a surface of the wafer 401, or a sidewall angle of a trench extending into a surface of the wafer 401. Alternatively or in addition the characteristic features may contain information about thickness and/or composition of a topmost layer covering the wafer 401 or about other physical properties or characteristics such as line edge roughness, line width roughness, overlay data, wafer shape, wafer deformation, defect density as well as about results of defect and electrical measurements.

In a first phase, the metrology unit 330 inspects the wafers 401 according to an original sampling plan using a first number of sampling points and transmits the results of inspection to the APC unit 290. The APC unit 290 receives the results of inspection, calculates corrected exposure parameters and transmits the corrected exposure parameters to the exposure tool assembly 320.

The calculation unit 200 may receive the results of inspection and the corrected exposure parameters and simulates the CD for the characteristic features for a plurality of subsets of the sampling points. A further instance may compare the actual deviations with the measured CD values and may modify the sampling plan according to a best-of strategy.

For example, the calculation unit 200 may transfer information descriptive for the de-corrected values to a user interface 205 and a user modifies the sampling plan in response to the information presented to him at the user interface 205, wherein the modification aims at omitting sampling points that do not improve system performance.

According to other embodiments the calculation unit 200 may transfer the information descriptive for the de-corrected values to an expert system or the calculation unit 200 may include an expert stage that modifies the sampling plan according to a best-of strategy without further user interaction.

For example, the calculation unit 200, the expert system or the user may compare the actual deviations for a critical dimension with the deviation in case of omission of one or more sampling points of the original sampling plan. In case the hypothetical deviation is equal to, smaller than or only marginally worse than the actual deviation, the calculation unit 200, the expert system or the user removes the sampling point(s) in question from the sampling plan such that at least the metrology unit 330 uses only the updated sampling plan 334.

According to an embodiment the calculation unit 200 determines first model coefficients of a wafer model on the basis of the original sampling plan and determines second model coefficients of the wafer model on the basis of a true subset of the sampling points of the original sampling plan. If a deviation between the first and second model coefficients is below a pre-defined threshold the calculation unit 200 may be controlled to replace the original sampling plan with a new sampling plan comprising the true subset of the sampling points.

For the next wafers 401, the metrology unit 330 uses less sampling points without loss of quality of the APC. A further metrology unit 350 may use the updated sampling plan 334.

Figure 9:
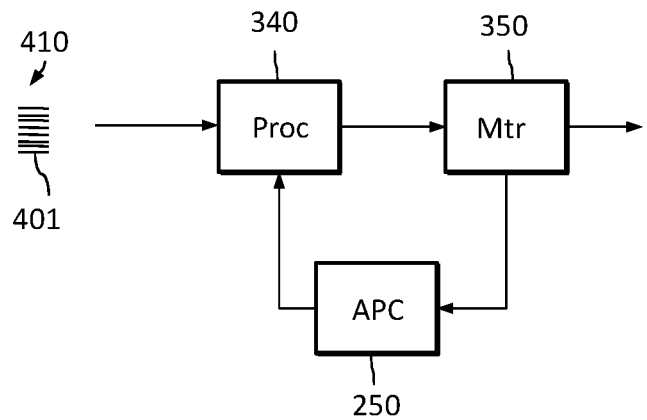
FIG. 9 is a schematic block diagram of a portion of a semiconductor device fabrication assembly including a calculation unit according to an embodiment concerning control of an etch process.

FIG. 9 refers to an embodiment concerning advanced process control as described above for a patterning process, e.g., an etch process.

Wafers 401 coated with a patterned and developed photoresist layer are transferred to a post-exposure process unit 340. The process unit 340 may include an etching tool imaging the resist pattern into the wafer, e.g., into a base substrate and/or into a layer or layer stack deposited on the base substrate, wherein a substrate pattern is formed in the wafer 401.

In the substrate pattern, CDs such as pattern depth, linewidth, slope angle, line roughness and others depend on parameters of the etch process such as etchant concentration, etch temperature, etch time, plasma voltage, and plasma frequency. A further metrology unit 350 obtains the CDs of the substrate pattern at predefined measurement sites that may be defined in a sampling plan.

A process control unit 250 may control one or more of the parameters of the etch process in the way described above for focus and exposure dose of an exposure tool.

Figure 10:
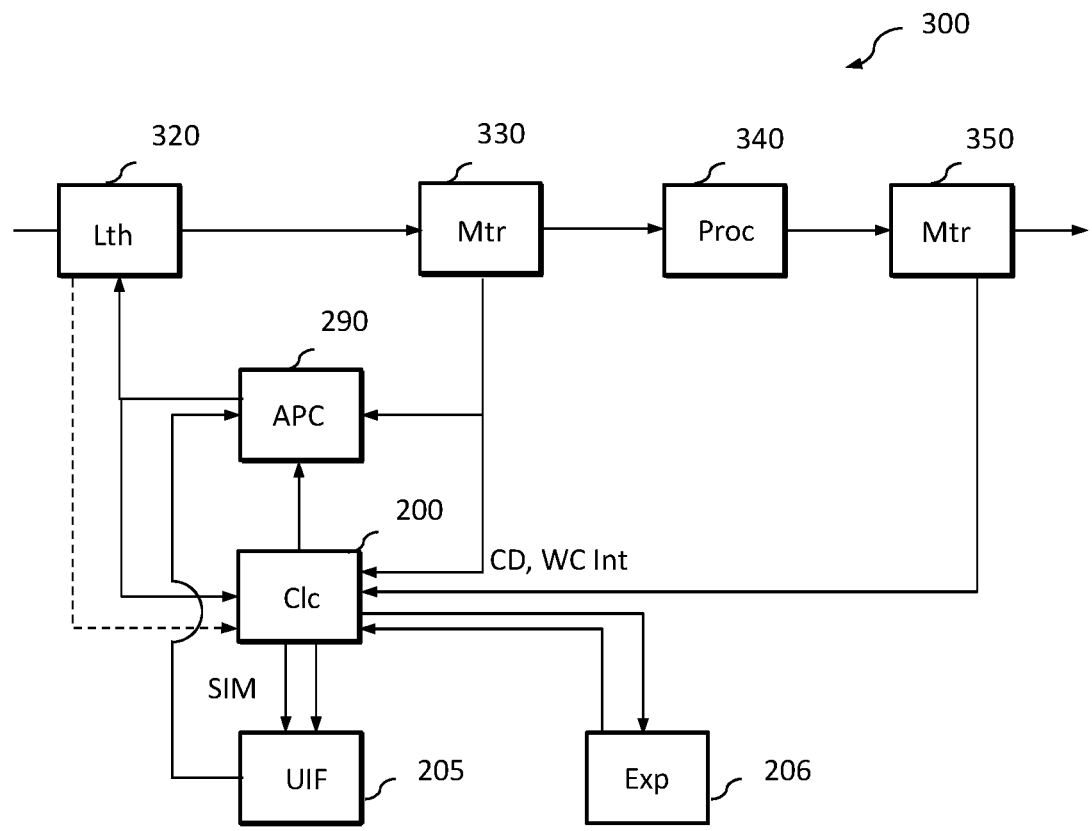
FIG. 10 is a schematic block diagram of a portion of a semiconductor device fabrication assembly according to a further embodiment.

FIG. 10 refers to an embodiment of an advanced process control that is effective on a combination of an exposure process and a post-exposure process e.g., an etch process.

Defocus and exposure dose used in an exposure tool assembly 320 may be controlled in the way as described with reference to FIG. 2 to FIG. 5 provided that the calculation unit 200 uses the CDs of substrate patterns obtained at a further metrology unit 350 that inspects the wafers 401 after a post-exposure process. CD drifts caused by fluctuations of etch parameters may be compensated by suitable settings in the exposure tool assembly 320.

What is claimed is:

1. An advanced process control method comprising:
exposing, by using an exposure tool assembly, photoresist layers coating semiconductor substrates to an exposure beam, wherein for each exposure a current exposure parameter set comprising at least a defocus value and an exposure dose is used;
developing the exposed photoresist layers to form resist patterns;
measuring feature characteristics in the resist pattern and/or a substrate pattern derived from the resist pattern, and updating the current exposure parameter set in response to deviations of the measured feature characteristics from target feature characteristics;
estimating de-corrected feature characteristics of hypothetical resist patterns formed without updating the exposure parameter set; and
changing a measurement strategy for the feature characteristics in response to information obtained from the de-corrected feature characteristics by modifying a sampling plan that comprises position information about sampling points on a surface of the semiconductor substrates, wherein the feature characteristics are measured at the sampling points.

2. The method of claim 1, further comprising:
exposing, by using the exposure tool assembly, a photoresist layer coating a semiconductor substrate to an exposure beam, wherein the updated exposure parameter set is used.

3. The method of claim 1, comprising:
updating the current exposure parameter set in response to information obtained from the de-corrected feature characteristics and from wafer context information, wherein the wafer context information contains information about process history of the semiconductor substrates.

4. The method of claim 3, wherein
updating the current exposure parameter exclusively considers semiconductor substrates assigned to a substrate group, wherein the semiconductor substrates assigned to the substrate group share at least one common parameter in the wafer context information and wherein the substrate group comprises a true subset of the semiconductor substrates.

5. The method of claim 4, wherein
de-corrected feature characteristics of the semiconductor substrates assigned to the substrate group show a correlation that differs from a correlation among the de-corrected feature characteristics of all the semiconductor substrates.

6. The method of claim 1, comprising:
determining first model coefficients of a wafer model on the basis of an original sampling plan including a first number of sampling points;
determining second model coefficients of the wafer model on the basis of a true subset of the sampling points; and
replacing the original sampling plan with a new sampling plan comprising the true subset of the sampling points if a deviation between the first and second model coefficients is below a pre-defined threshold.

7. The method of claim 1, wherein
the resist pattern and/or the substrate pattern comprises a plurality of resist features and the feature characteristics comprise at least one of a diameter of a circular resist feature, a side wall angle of a resist feature, a height dimension of a resist feature, a length of a short axis of a non-circular resist feature, a length of a long axis of a non-circular resist feature, a line width of a stripe-shaped resist feature, a width of a space between resist features, an area of a resist feature and a line edge roughness of a resist features.

8. A wafer fabrication assembly comprising:
an exposure tool assembly configured i) to expose photoresist layers coating semiconductor substrates to an exposure beam according to a current exposure parameter set and ii) to form resist patterns from the exposed photoresist layers;
a metrology unit configured to measure feature characteristics of at least one of the resist pattern and a substrate pattern derived from the resist pattern;
an APC unit configured to update the exposure parameter sets in response to deviations of the measured feature characteristics from target feature characteristics; and
a calculation unit configured to estimate de-corrected feature characteristics of hypothetical resist patterns formed without updating the exposure parameter sets, wherein the calculation unit is further configured to change a measurement strategy for the feature characteristics of the metrology unit by modifying a sampling plan that comprises position information about sampling points on a surface of the semiconductor substrates, wherein the feature characteristics are measured at the sampling points.

9. The wafer fabrication assembly of claim 8, wherein
the calculation unit is configured to update the current exposure parameter set in response to information obtained from the de-corrected feature characteristics.

10. The wafer fabrication assembly of claim 9, wherein
the calculation unit is configured to update the current exposure parameter set in response to information obtained from the de-corrected feature characteristics and from wafer context information, wherein the wafer context information contains information about process history of the semiconductor substrates.

11. The wafer fabrication assembly of claim 10, wherein
the calculation unit is configured to update the current exposure parameter exclusively on the basis of semiconductor substrates assigned to a substrate group, wherein the semiconductor substrates assigned to the substrate group share at least one common parameter in the wafer context information and wherein the substrate group comprises a true subset of the semiconductor substrates.

12. The wafer fabrication assembly of claim 11, wherein
de-corrected feature characteristics of the semiconductor substrates assigned to the substrate group show a correlation that differs from a correlation among the de-corrected feature characteristics of all the semiconductor substrates.

13. The wafer fabrication assembly of claim 8, further comprising:
a data interface connecting the calculation unit and the APC unit, wherein the APC unit is configured to update the exposure parameter sets in response to information received from the calculation unit.

14. The wafer fabrication assembly of claim 8, wherein
the calculation unit is configured to determine first model coefficients of a wafer model on the basis of an original sampling plan including a first number of sampling points, to determine second model coefficients of the wafer model on the basis of a true subset of the sampling points of the original sampling plan, and to output information descriptive for the first and second model coefficients.

15. The wafer fabrication assembly of claim 8, wherein the calculation unit is configured to simulate de-corrected feature characteristics of hypothetical resist patterns for alternative settings for at least one of a sampling plan, an automated process control and a wafer model.

\* \* \* \* \*